United States Patent
Segawa et al.

(10) Patent No.: US 6,451,636 B1
(45) Date of Patent: *Sep. 17, 2002

(54) SEMICONDUCTOR DEVICE AND DISPLAY DEVICE HAVING LASER-ANNEALED SEMICONDUCTOR ELEMENT

(75) Inventors: Yasuo Segawa, Gifu; Ryoichi Yokoyama, Ohgaki; Kiyoshi Yoneda, Motosu-gun; Tsutomu Yamada, Ohgaki, all of (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,081

(22) Filed: Sep. 10, 1998

(30) Foreign Application Priority Data

Sep. 12, 1997 (JP) ............................................. 9-248751
Sep. 12, 1997 (JP) ............................................. 9-248752
Sep. 30, 1997 (JP) ............................................. 9-266679

(51) Int. Cl.[7] ........................ H01L 21/338; H01L 21/00; H01L 21/20
(52) U.S. Cl. ........................ 438/166; 438/149; 438/308; 438/487; 438/535; 438/795
(58) Field of Search ........................ 257/72, 66; 438/24, 438/795, 308, 487, 535, 149, 166, 488, 479, 490; 427/596

(56) References Cited

U.S. PATENT DOCUMENTS

| | | | | |
|---|---|---|---|---|
| 4,466,179 A | * | 8/1984 | Kasten ......................... 29/576 |
| 5,145,808 A | * | 9/1992 | Sameshima et al. ......... 437/173 |
| 5,365,875 A | * | 11/1994 | Asai et al. .................... 438/487 |
| 5,496,768 A | * | 3/1996 | Kudo ............................ 438/487 |
| 5,529,951 A | * | 6/1996 | Noguchi et al. ............. 437/174 |
| 5,589,406 A | | 12/1996 | Kato et al. ...................... 437/21 |
| 5,591,668 A | * | 1/1997 | Maegawa et al. ............ 437/174 |
| 5,616,506 A | * | 4/1997 | Takemura ..................... 438/150 |
| 5,789,763 A | | 8/1998 | Kato et al. ..................... 257/72 |
| 5,808,318 A | | 9/1998 | Masumo et al. ............... 257/66 |
| 5,808,595 A | | 9/1998 | Kubota et al. ................. 345/92 |
| 5,903,014 A | * | 5/1999 | Ino et al. ........................ 257/66 |
| 5,942,856 A | | 8/1999 | Koyama ................... 315/169.3 |
| 5,943,593 A | | 8/1999 | Noguchi et al. ............. 438/487 |
| 5,960,323 A | * | 9/1999 | Wakita et al. ............... 438/795 |
| 5,981,974 A | * | 11/1999 | Makita ........................... 257/72 |
| 6,028,577 A | | 2/2000 | Sakamoto ...................... 345/92 |
| 6,037,924 A | | 3/2000 | Koyama et al. ............... 345/92 |
| 6,057,183 A | * | 5/2000 | Koyama et al. ............. 438/166 |
| 6,096,581 A | * | 8/2000 | Zhang et al. ................ 438/149 |

OTHER PUBLICATIONS

Kubo et al., "Characteristics of Polycrystalline–Si Thin Film Transistors Fabricated by Excimer Laser Annealing Method", IEEE Transactions on Electron Devices, Oct. 1994, pp. 1876–1879.*

Kohno et al., "High Performance Poly–Si TFTs Fabricted Using Pulsed Laser Annealing and Remote Plasma CVD with Low Temperature Processing", IEEE Transactions on Electron Devices, Feb. 1995, pp. 251–257.*

Kuriyama, "Excimer laser crystallization of silicon films for AMLCDs", AMLCD Second International Workshop on Active Matrix Liquid Crystal Displays, Sep. 1995, pp. 87–92.*

* cited by examiner

*Primary Examiner*—Tom Thomas
*Assistant Examiner*—Lex H. Malsawma
(74) *Attorney, Agent, or Firm*—Hogan & Hartson, LLP

(57) ABSTRACT

Regarding an element having a channel width W greater than a pitch P of a pulse laser beam, a direction of the channel width W of a channel region CH is inclined with respect to a direction of a major axis of a line beam LB. Consequently, even if a defective crystallization region R is caused by an nonuniform intensity of an irradiated region in laser annealing forming p-Si of a p-Si TFT LCD, the whole channel width W of the channel region CH does not overlap the defective crystallization region R. Therefore, even if the defective crystallization region R is generated, element characteristics are not affected. Thus, the manufacturing yield of an excellent p-Si LCD can be enhanced.

28 Claims, 15 Drawing Sheets

SEMICONDUCTOR DEVICE AND DISPLAY DEVICE HAVING LASER-ANNEALED SEMICONDUCTOR ELEMENT

BACKGROUND OF THE INVENTION

1. Field of the Invention

The present invention relates to a semiconductor device, and more particularly to a semiconductor device or a display device using a polycrystalline semiconductor layer obtained by laser annealing a non-single crystal semiconductor layer on a substrate.

2. Description of the Prior Art

A flat display device comprising a display element using a liquid crystal and organic electroluminescence as optical members is small-sized, thin and has low power consumption, and has been developed for practical use in the field of OA apparatus, AV apparatus and the like. A liquid crystal display (LCD) and an organic EL display of an active matrix type having a thin film transistor (TFT) formed on a substrate supporting a liquid crystal and EL as a switching element for controlling the timing of holding and writing image data in each pixel has become commonplace because of high display quality. In particular, a display of a driver built-in type has been developed in which a TFT is used as a switching element of each pixel and is also used for a driver to drive the switching element, and the driver is formed together with the switching element on the periphery of a display area where each pixel is arranged. Consequently, size and cost can be reduced still further.

For the display of a driver built-in type, a TFT using a polycrystalline semiconductor film, particularly, polysilicon (p-Si) as a channel layer is suitable because it can achieve an operating speed which is also applicable to a driver and has a low deposition temperature resulting in formation on an inexpensive glass substrate having low heat resistance. When the polysilicon is to be formed, amorphous silicon formed on the substrate is laser annealed so that crystallization can be performed with a support substrate temperature set to 400 to 600° C. The TFT is formed using p-Si thus obtained. Using this method, a driver circuit can be fabricated on a non-alkaline glass substrate.

The amorphous silicon (a-Si) is laser annealed by using a laser irradiation apparatus. In the laser irradiation apparatus, an optical system shapes a pulse laser beam emitted from a laser oscillation source into a beam having a predetermined section, and the beam thus obtained is irradiated on an amorphous silicon film formed on a processed substrate. The laser beam to be shaped and irradiated on the silicon film is, for example, square, and more particularly has the form of a belt or line in which a length in a direction of a major axis is much greater than that in a direction of a minor axis. A stage of the laser irradiation apparatus to be mounted on the processed substrate having an a-Si film formed thereon is movable horizontally and vertically in a plane direction. The stage is moved horizontally or vertically so that a pulse laser beam is relatively scanned over the a-Si film formed on the processed substrate horizontally or vertically.

FIG. 1 shows an enlarged sectional structure of a TFT portion formed on the processed substrate at a laser. annealing step A gate electrode 11 of a TFT is formed on a substrate 10 such as a non- alkaline glass. A gate insulation film 12 is formed to cover the gate electrode 11 and an a-Si film 13a which is a film to be laser annealed is formed on the gate insulation film 12. When a pulse laser beam is irradiated on the a-Si film 13a to perform the laser annealing, the a-Si film 13a is polycrystallized to form a p-Si film 13.

FIG. 2 shows a sectional structure of the TFT formed by using the p-Si film 13 obtained by laser annealing. FIG. 3 shows a planar structure of the obtained TFT. FIGS. 1 and 2 show sections taken along the line A—A in FIG. 3.

The p-Si film 13 obtained by laser annealing the a-Si film 13a is subjected to patterning in the shape of an island across a portion above the gate electrode 11. A region positioned just above the gate electrode 11 in the island-shaped p-Si film 13 is a non-doped channel region CH. A LD (Lightly Doped) region LD which is doped with an impurity having a low concentration is formed on both sides of the non-doped channel region CH, and a source region S and a drain region D which are doped with an impurity having a high concentration are formed on the outside of the LD region LD. An interlayer insulation film 15 such as $SiN_x$, $SiO_2$ or the like is formed to cover an implantation stopper film 14 used as a mask when the p-Si film 13 and the LD region LD are to be formed. A source electrode 16 and a drain electrode 17 are formed on the interlayer insulation film 15, and are connected to the source region S and the drain region D through a contact hole CT formed in the interlayer insulation film 15, respectively.

In a display unit, for example an LCD, pixels re usually arranged in a matrix and TFTs for driving the pixels and wirings are correspondingly placed in horizontal and vertical scanning directions, respectively. Accordingly, when these display elements are usually placed on a rectangular substrate, the directions of a plurality of TFTs formed on the processed substrate, that is, extension directions of channel widths or channel lengths of the channel regions CH, are any of a horizontal scanning direction H and a vertical scanning direction V of the LCD with respect to a substrate plane. In other words, the directions of the channels of the TFT elements are parallel or perpendicular to each other. A direction of a line beam, that is, a side of the line beam, a side of the substrate and the like are held in the horizontal scanning direction H or the vertical scanning direction V.

FIG. 4 is a graph showing a relationship between an irradiation laser energy on the a-Si film 13a (an axis of abscissa) and a grain size of the p-Si film 13 formed at that time (an axis of ordinate). As the energy is increased, the grain size is also enlarged. If an energy value Eo with which a maximum grain size is obtained is exceeded, the grain size is rapidly reduced. Accordingly, the energy should be kept within a narrow range between Ed and Eu in order to obtain a predetermined grain size.

For this reason, if the irradiation energy of the line beam is slightly varied and moves out of the optimum range between Ed and Eu, crystallization cannot be performed fully so that a defective crystallization region R having a small grain size is generated on a certain region in the p-Si film 13.

A positional relationship between a layout of each circuit element for liquid crystal driving which is formed on a processed substrate, for example, and an irradiated pulse laser beam is usually set as shown in FIG. 5. In FIG. 5, a mother substrate 59 acting as the processed substrate has a plurality of regions forming an active matrix substrate used for a TFT LCD (six regions, each of which will be hereinafter referred to as an active matrix substrate 2). Each active matrix substrate 2 is subjected to various manufacturing steps so that pixels are formed in a matrix and a p-Si TFT to be connected to each pixel is formed in a region 43 of FIG. 5, resulting in a display area (hereinafter referred to as a display area 43). Driver sections 44 and 45 are formed around the display area 43. The driver sections 44 and 45 serve to drive the p-Si TFT of the display area 43 and utilize a p-Si TFT formed almost simultaneously with the formation of the p-Si TFT of the display area 43.

FIG. 5 shows a state in which an amorphous silicon (a-Si) film is formed in a necessary region of the mother substrate 59 and a line-shaped laser beam that causes an irradiated region LB to extend in the vertical scanning direction V is sequentially shifted and irradiated on the a-Si film in the horizontal scanning direction H to perform annealing. By such laser annealing, a-Si is polycrystallized so that a p-Si film constructing a channel region of the TFT is obtained.

Thus, the annealing is performed by irradiating the pulse laser beam while sequentially shifting a position of the pulse laser beam. Therefore, a direction of an edge of the region where the laser beam is irradiated is usually coincident with the direction of the sides of the processed substrate as shown in FIG. 5 It has been confirmed that the defective crystallization region R is easily generated in the direction of the edge of the region LB where the laser beam is irradiated. In particular, a direction of a major axis of the region LB orthogonal to the scanning direction of the beam which is coincident with the horizontal scanning direction H of the substrate is shown in FIG. 5.

For this reason, a relationship between the channel region of the TFT formed on the processed substrate and the defective crystallization region R is often set as shown in FIG. 3 For example, a TFT used for the drivers 44 and 45 or the like takes a slender shape having a channel width W of the channel region CH greater than a channel length L as shown in FIG. 3 in order to particularly enhance operating speed and driving capability. A TFT used for a TFT LCD or the like often has the direction of a channel width and that of a channel length which are coincident with the directions of the sides of the substrate as described above. With such a layout, the direction of a channel, that is, an extension of the channel width W and an extension of a major axis of the defective crystallization region R are parallel or perpendicular to each other as shown in FIG. 3.

FIG. 3, in the case where a defective crystallization region $R_L$ divides the channel region CH vertically, that is, a defective crystallization region $R_L$ is generated in the direction of the length of the TFT channel A part MN of a moving path in the channel region CH is occupied by the defective crystallization region $R_L$ to cause deterioration and a residual moving path MG does not overlap the defective crystallization region $R_L$ in the direction of the channel width Accordingly, a width of the moving path decreases so that a substantial channel width is reduced. However, electrical characteristics are not greatly affected but elements can perform normal operation.

On the other hand, in a case where the defective crystallization region $R_W$ divides the channel region CH transversely, that is, the defective crystallization region $R_W$ generated in the direction of the channel width is formed to have a length greater than the channel width, a moving path MNh of the TFT is blocked over the whole channel width by the defective crystallization region Rw even if the defective crystallization region $R_W$ is a part of the channel region CH. Therefore, the characteristics of the TFT are noticeably deteriorated.

SUMMARY OF THE INVENTION

The present invention provides a semiconductor device having a plurality of semiconductor elements formed on a substrate, some or all of the semiconductor devices having a channel region formed in a semiconductor film annealed by irradiation of a pulse laser beam, a channel width of the channel region being greater than a mutual pitch of the pulse laser beam irradiated by shifting a position, and the channel region being formed in such a manner that the direction of the channel width is not coincident with the directions of the major and minor axes of a region where the pulse laser beam is irradiated.

Furthermore, the present invention is characterized in that the directions of the sides of the substrate are almost the same as the directions of the major and minor axes of the region where the pulse laser beam is irradiated, and the direction of the channel width of the channel region is different from the directions of the sides of the substrate.

Alternatively, it is also possible to employ a structure in which the directions of the sides of the substrate are almost the same as the direction of the channel width of the channel region, and the directions of the major and minor axes of the region where the pulse laser beam is irradiated are different from the directions of the sides of the substrate.

With such a structure, even if a defective laser-annealed region formed in the semiconductor film with the same width as the pitch of the pulse laser beam is generated in the vicinity of the channel region of the semiconductor element, the channel region can be prevented from being occupied by the defective processed region over the whole channel width. Consequently, characteristics of the semiconductor element can be prevented from being deteriorated.

In the present invention, it is also possible to use a structure in which some semiconductor elements have a polycrystalline semiconductor film formed on the substrate by polycrystallizing an amorphous semiconductor by annealing using irradiation of a pulse laser beam, a channel region formed in an island region of the polycrystalline semiconductor film, and a gate electrode formed to overlap the channel region with an insulation film provided therebetween.

In another aspect of the present invention, a channel width W of the channel region, a pitch P of the pulse laser beam, and an angle θ formed by the direction of the channel width of the channel region and the direction of the major axis of the region where the pulse laser beam is irradiated have a relationship satisfying W·sin θ>P.

Furthermore, it is also possible to apply a structure if a channel length of the channel region is set to L, a pitch P of the pulse laser beam and the angle θ formed by the direction of the channel width of the channel region and the direction of the major axis of the region where the pulse laser beam is irradiated have a relationship satisfying W·sin θ−L cos·θ>P.

With such a structure where the defective treated region obtained by the annealing is formed in the vicinity of the channel region of the semiconductor element, the channel region can be reliably prevented from being occupied by the defective treated region over the entire channel width.

In yet another aspect of the present invention, if a channel width W of the channel region, a channel length L of the channel region, a pitch P of the pulse laser beam, and an angle θ formed by the direction of the channel width of the channel region and the direction of the major axis of the region where the pulse laser beam is irradiated have a relationship satisfying W·sin θ−L·cos θ>P, the channel region can be more reliably prevented from being occupied by a defective annealed region.

A further aspect of the present invention is directed to a semiconductor device having a plurality of semiconductor elements formed on a substrate, some or all of the semiconductor elements formed on a substrate, some or all of the semiconductor devices having a polycrystalline semiconductor film formed on the substrate by polycrystallizing an amorphous semiconductor by annealing using irradiation of a pulse laser beam, a channel region formed in an island region of the polycrystalline semiconductor film, and a gate electrode formed to overlap the channel region with an insulation film provided therebetween, the semiconductor device having a lightly doped drain structure, a channel width of the channel region being greater than a mutual pitch of the pulse laser beam irradiated by shifting a position, and the channel region being formed in such a manner that a direction of the channel width is not coincident with the directions of the major and the minor axes of a region where the pulse laser beam is irradiated.

Also in such a semiconductor element having a LDD structure, the channel region of the semiconductor device is formed to have the above-mentioned relationship with the pitch of the pulse laser beam. Consequently, the characteristics of the semiconductor device can be prevented from being deteriorated.

Furthermore, the present invention is characterized in that a channel width W of the channel region, a channel length L of the channel region, a length L1 of the lightly doped region, a pitch P of the pulse laser beam, and an angle θ formed by the direction of the channel width of the channel region and the direction of the major axis of the region where the pulse laser beam is irradiated can have a relationship to satisfy W·sin θ−(L+L1)·cos θ>P.

By employing such a structure of the semiconductor device, where the defective treated region obtained by the annealing is formed in the vicinity of the channel region of the semiconductor element having the LDD structure, the channel region and the LD region which greatly affected element characteristics can be reliably prevented from being occupied by the defective treated region in the direction of the channel width.

A further aspect of the present invention is directed to a display device having the same characteristics as in the above-mentioned semiconductor device. The display device comprises, on a substrate, a plurality of first thin film transistors for supplying a display signal to corresponding pixels, respectively, and a plurality of second thin film transistors constructing a driver circuit for driving the first thin film transistors, the first and/or second thin film transistors having channel regions provided in polycrystalline semiconductor films formed on the substrate by polycrystallizing an amorphous semiconductor by annealing using irradiation of a pulse laser beam, some or all of the second thin film transistors having a channel width of the channel region which is greater than a mutual pitch of the pulse laser beam irradiated by shifting a position, and the channel region being formed in such a manner that the direction of the channel width is not coincident with directions of the major and minor axes of a region where the pulse laser beam is irradiated.

If characteristics of the second thin film transistors for driving the first thin film transistors corresponding to the pixels are deteriorated, the quality of the display is significantly affected than in a deterioration in characteristics of the first thin film transistors. Accordingly, the channel regions of the second thin film transistors are formed as described above so that they can be prevented from being occupied over the entire channel widths by the defective treated region obtained by the laser annealing. Thus, the characteristics of the second thin film transistors can be prevented from being deteriorated.

The display device according to the present invention can have a structure in which a channel width W of the channel region, a pitch P of the pulse laser beam, and an angle θ formed by the direction of the channel width of the channel region and the direction of the major axis of the region where the pulse laser beam is irradiated have a relationship satisfying W·sin θ−P. With such a structure, the characteristics of the second thin film transistors can be reliably prevented from being deteriorated.

A further aspect of the present invention is directed to a semiconductor device having a plurality of semiconductor elements formed on a substrate, some or all of the semiconductor elements having a channel region formed on a semiconductor film annealed by irradiation of a pulse laser beam, the channel region being formed by a plurality of channel region parts which are separated from each other and are electrically connected in parallel, and a sum of each of the channel widths of the channel region parts and a space between the channel region parts being greater than a mutual pitch of the pulse laser beam irradiated by shifting a position.

A further aspect of the present invention is directed to the semiconductor apparatus wherein the channel region parts are respectively separated in the directions of the channel widths.

Also in a case where the channel region of the semiconductor device is thus formed for the pitch of the pulse laser beam, the whole channel width of the channel region of the semiconductor device can be prevented from being occupied by the defective treated region obtained by the laser annealing. Thus, the characteristics of the semiconductor device can be prevented from being deteriorated.

A further aspect of the present invention is directed to a display device comprising, on a substrate, a plurality of first thin film transistors for supplying a display signal to corresponding pixels, respectively, and a plurality of second thin film transistors constructing a driver circuit for driving the first thin film transistors, the first and/or second thin film transistors having channel regions provided in polycrystalline semiconductor films formed on the substrate by polycrystallizing an amorphous semiconductor by annealing using irradiation of a pulse laser beam, some or all of the second thin film transistors having a channel region formed by a plurality of channel region parts which are separated from each other and are electrically connected in parallel, and a sum of each of the channel widths of the channel region parts and a space between the channel region parts being greater than a mutual pitch of the pulse laser beam irradiated by shifting a position.

If characteristics of the second thin film transistors for driving the first thin film transistors corresponding to the pixels as described above are deteriorated, the quality of display is more significantly affected than in a deterioration in characteristics of the first thin film transistors. The channel regions of the second thin film transistors are formed to have the above-mentioned relationship with the pitch of the pulse laser beam so that they can be prevented from being occupied over the whole channel widths by the defective treated region obtained by the laser annealing. Thus, the characteristics of the second thin film transistors can be prevented from being deteriorated.

DESCRIPTION OF THE PREFERRED EMBODIMENTS

Figure 5:
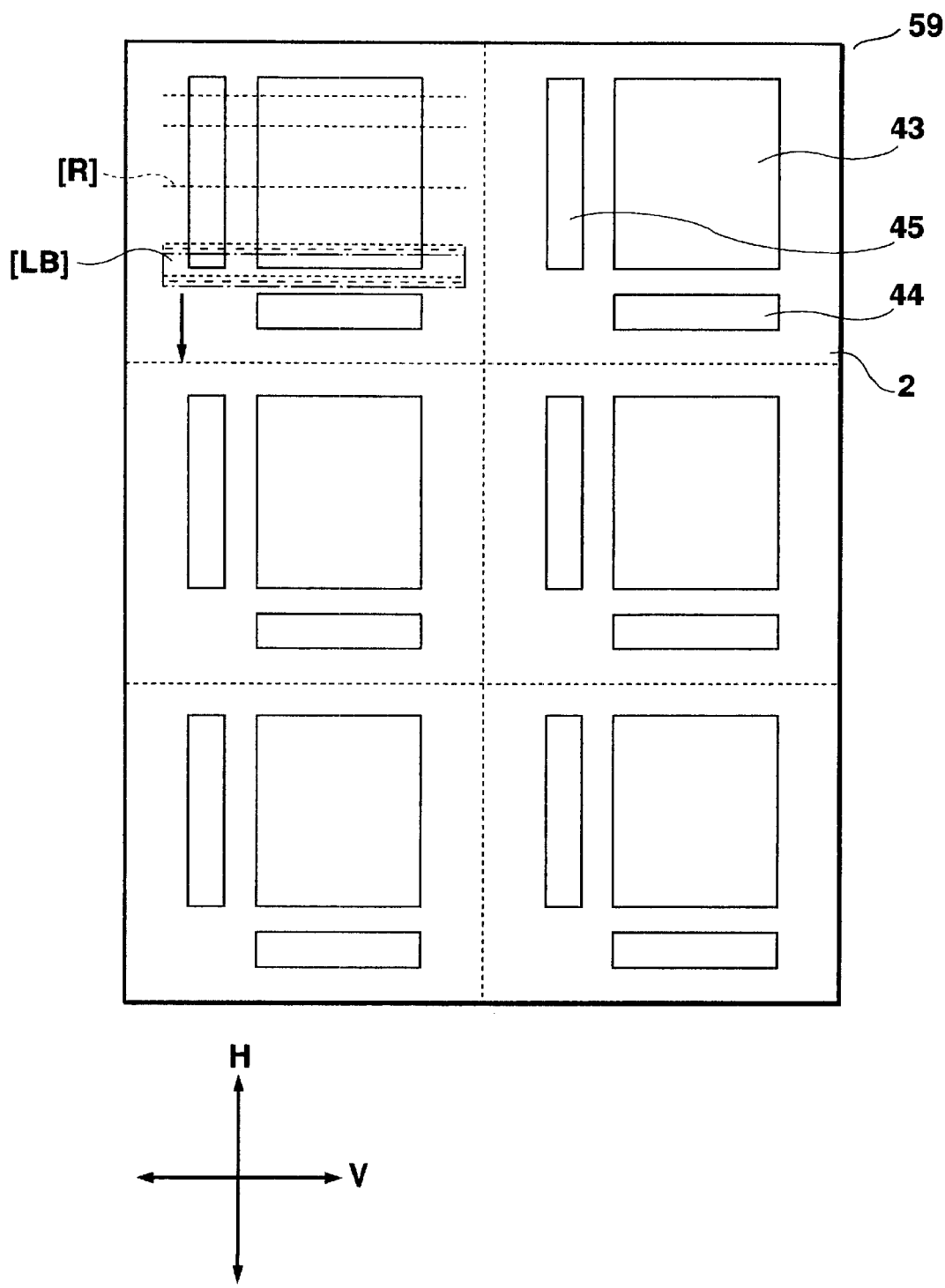
FIG. 5 is a view showing a layout of each circuit element on a treated substrate of a p-Si TFT LCD, and a general positional relationship between the treated substrate and a region where a line beam is irradiated.
Figure 6:
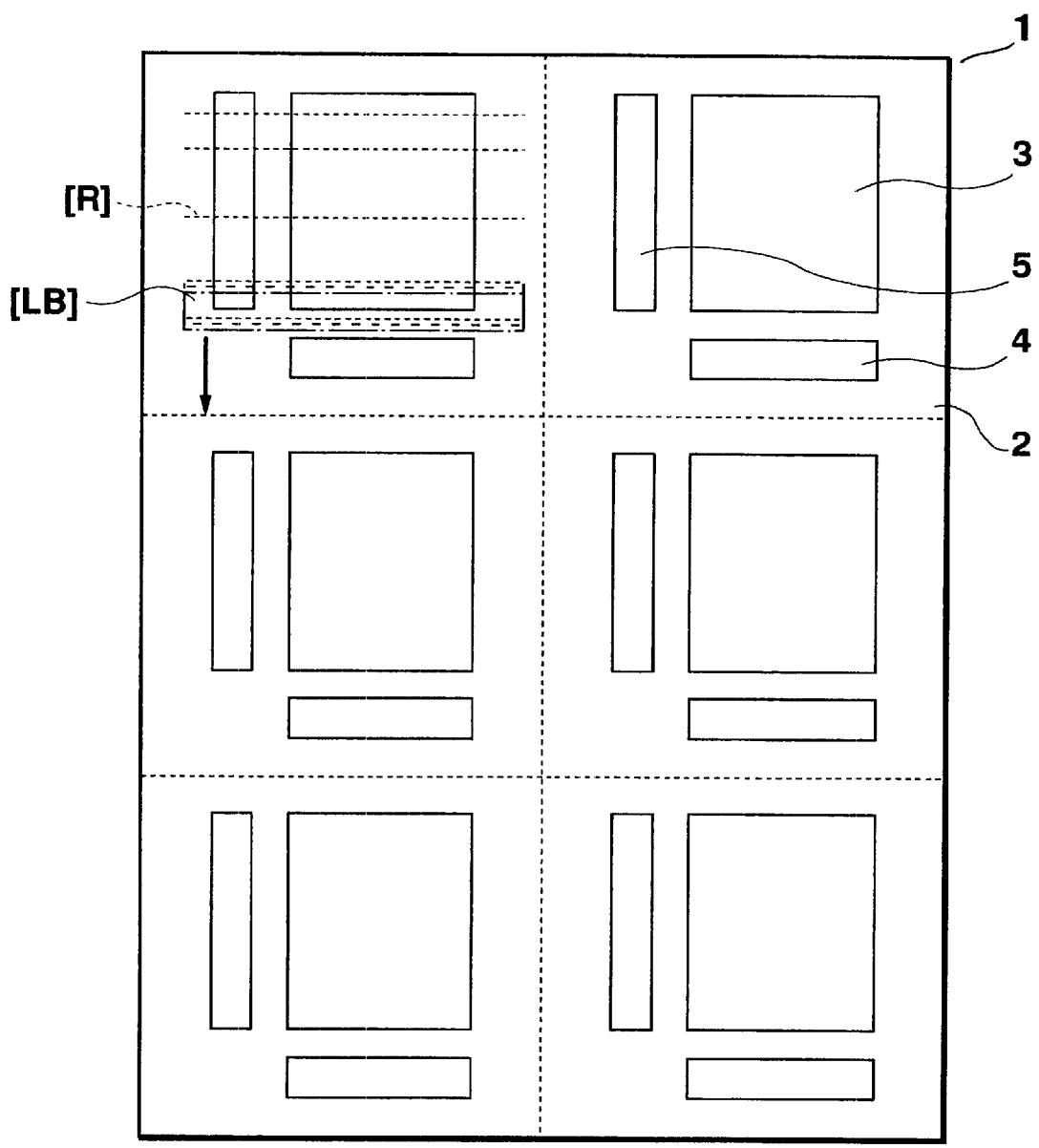
FIG. 6 is a view showing a layout of each circuit element on a treated substrate of an LCD, and a positional relationship between the treated substrate and a region where a line beam is irradiated according to an embodiment of the present invention.
Figure 6:
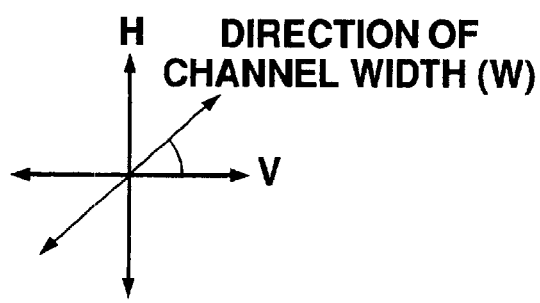
Figure 7:
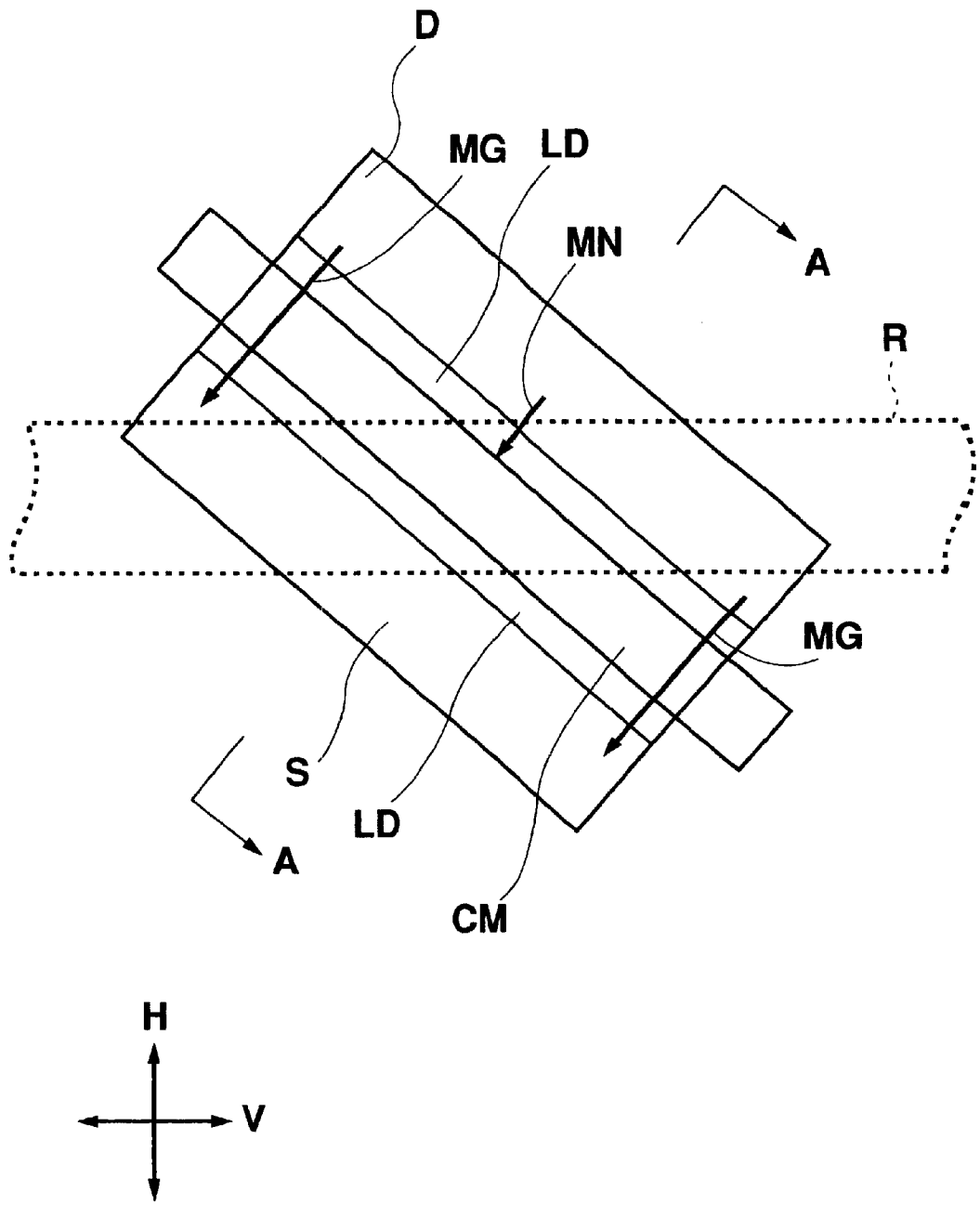
FIG. 7 is a plan view showing an example of a TFT structure of a driver section of the LCD and a positional relationship with a defective crystallization region according to the embodiment of the present invention.

With reference to FIGS. 6 and 7, a laser annealing method according to a first embodiment of the present invention will be described below. In FIG. 6, a mother substrate 1 includes a plurality of, for example, 6 active matrix substrates 2 to be used for a display in the same manner as in FIG. 5. In each of the active matrix substrates 2, the reference numeral 3 denotes a display area on which display elements are to be arranged in a matrix, the reference numeral 4 denotes a gate driver which is to be formed to generate a scanning signal for controlling switching to write a display signal to each display element, and the reference numeral 5 denotes a drain driver which is to be formed to supply a display signal to each display element synchronously with the scanning signal.

After each display element, wiring and other necessary circuits are formed, the active matrix substrates 2 are stuck to counter substrates including counter electrodes to form the display elements, respectively. The mother substrate 1 is separated for each active matrix substrate 2. A liquid crystal acting as an optical member is sealed between the active matrix substrate 2 and the opposite substrate which are stuck together. Thus, a liquid crystal display (LCD) is obtained.

In the display area 3, each display element is comprised with an LC capacitor having a liquid crystal as a dielectric layer, and a TFT acting as a switching element to apply, to the LC capacitor, a display signal voltage for driving the liquid crystal and to hold the display signal voltage for a predetermined period. In the driver sections 4 and 5, a CMOS transistor constituting an inverter is formed by N-ch and P-ch TFTs.

FIG. 6 shows a state in which an a-Si film formed on the mother substrate 1 is subjected to laser annealing. Each shot of a line beam LB which is a pulse laser beam is sequentially shifted on the substrate 1 with a predetermined overlap amount, that is, a predetermined pitch so that the laser beam is scanned over the whole substrate 1. Directions of major and minor axes of the line beam LB are coincident with horizontal and vertical scanning directions H and V of a display over a plane of the substrate 1, respectively.

Figure 1:
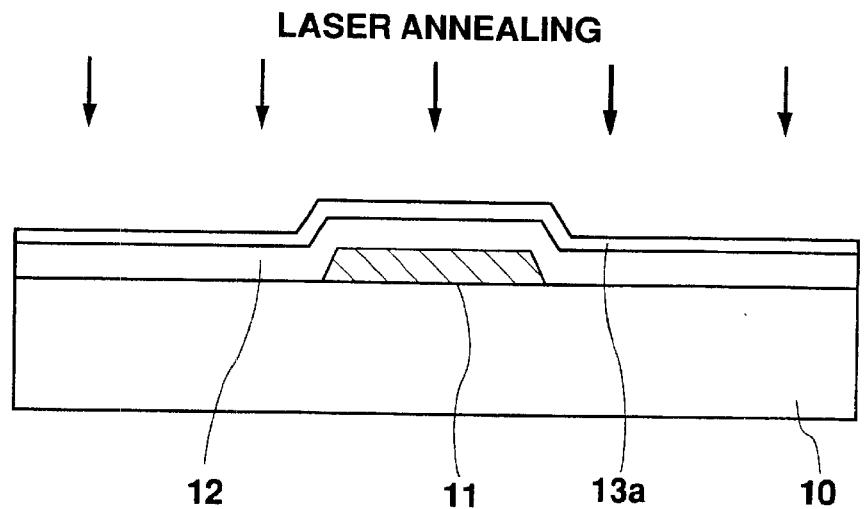
FIG. 1 is a sectional view showing a substrate to be treated at a step of laser annealing an a-Si film.
Figure 2:
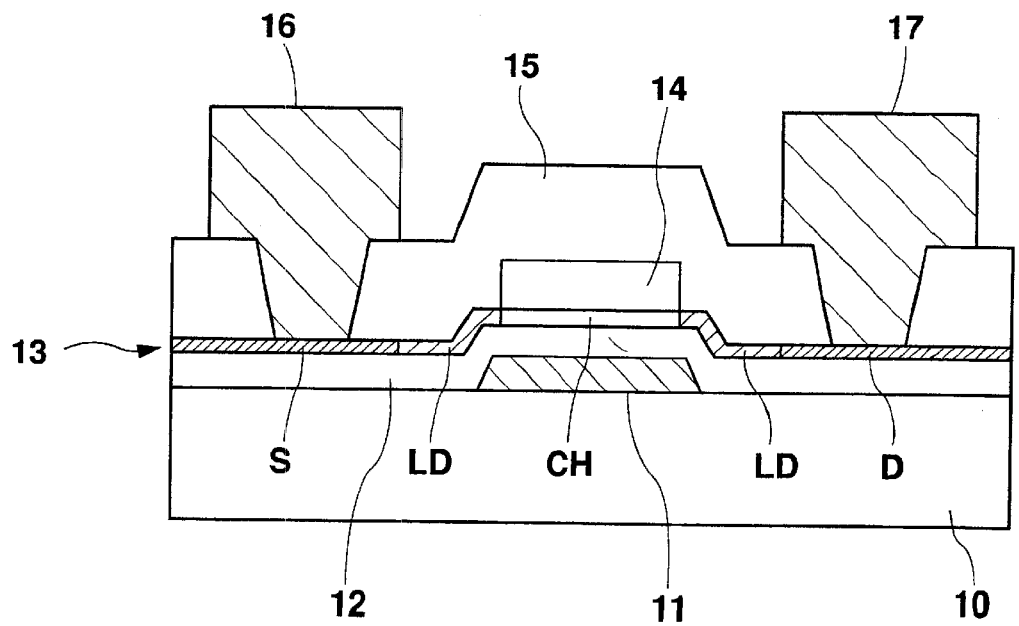
FIG. 2 is a view showing a sectional structure of a TFT.
Figure 3:
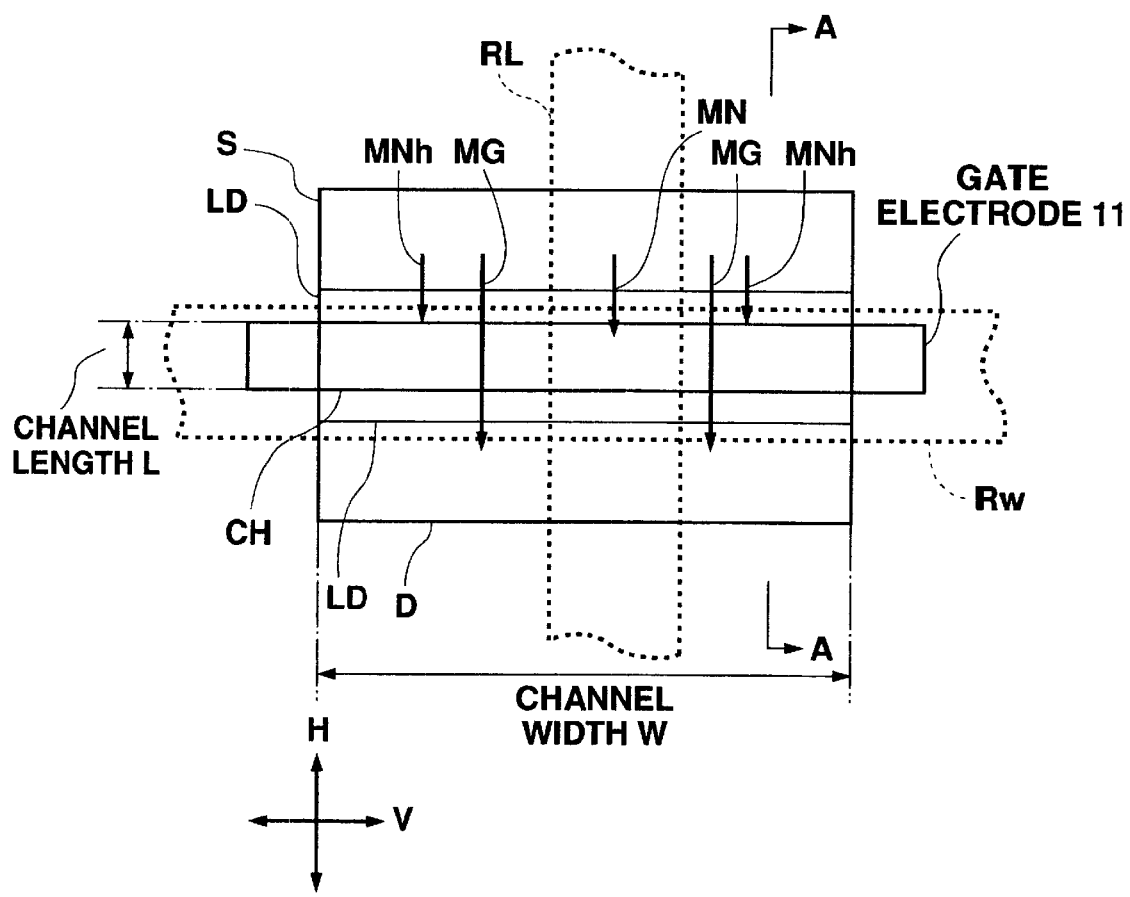
FIG. 3 is a view showing a planar structure of the TFT.
Figure 4:
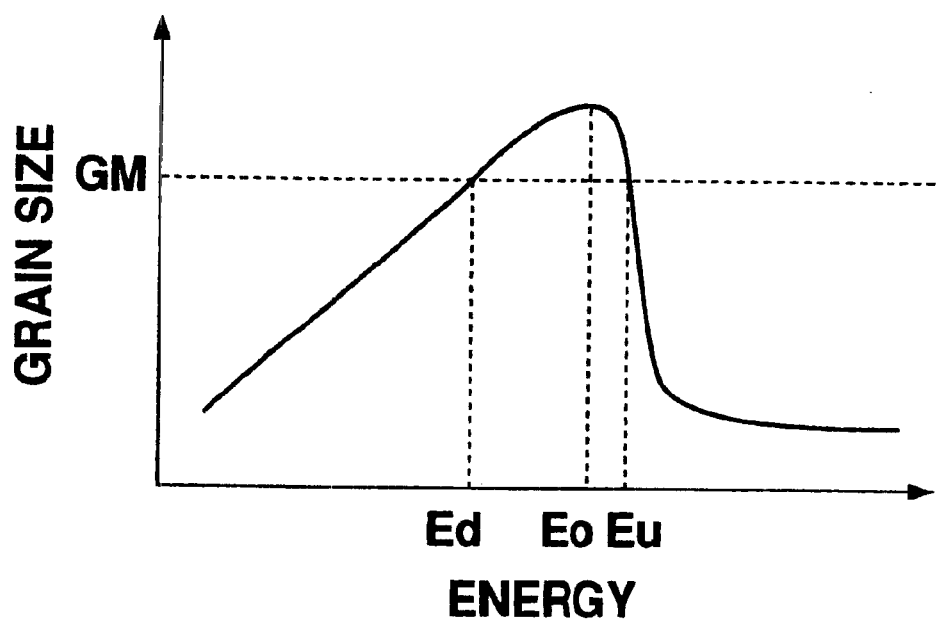
FIG. 4 is a graph showing a relationship between an irradiation laser energy in the laser annealing and a grain size of obtained p-Si.
Figure 8:
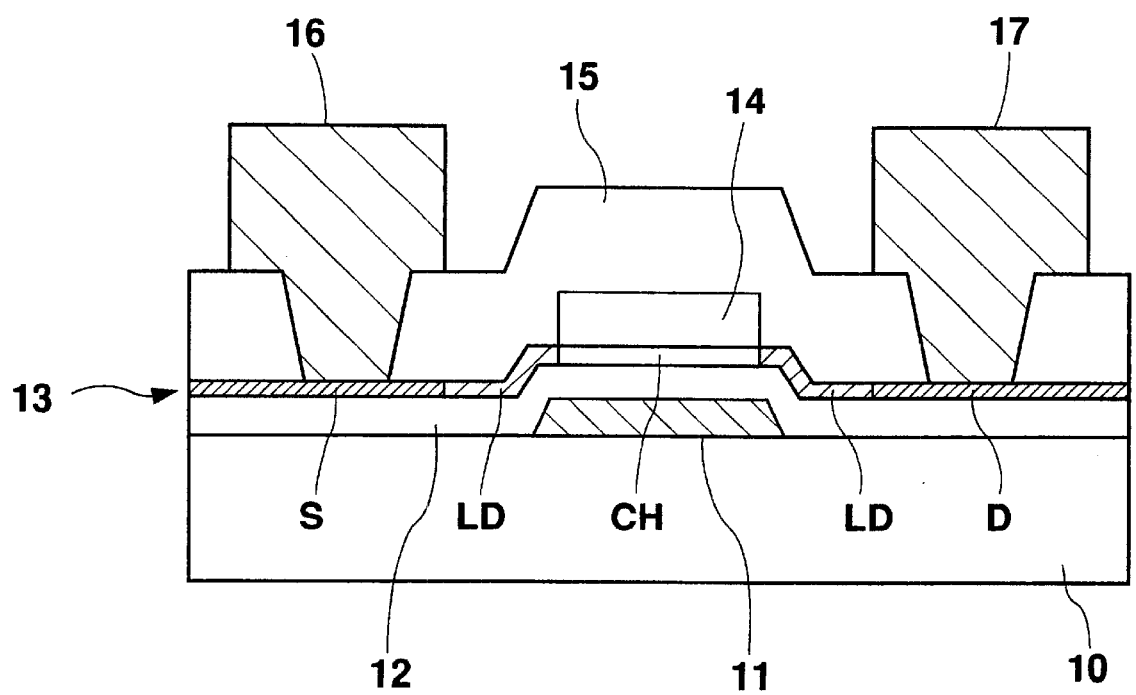
FIG. 8 is a view showing a sectional structure of the TFT taken along the line A—A in FIG. 7.

FIG. 7 is a plan view showing a TFT formed by using a p-Si film 13 obtained by laser annealing. A sectional structure taken along the line A—A in FIG. 7 is shown in FIG. 8. A TFT shown in FIG. 8 has the similar structure as in FIG. 2, and the same reference numerals denote corresponding portions. In the present invention, a direction of a channel region CH, that is, a direction of a channel width W and a direction of the line beam LB, that is, a direction of a major axis (which is coincident with the vertical scanning direction V) form an angle θ determined by a relationship which will be described below in detail.

First of all, the present applicant has discovered that a defective crystallization region R is generated in directions of sides of the line beam LB as shown in FIG. 6 for the following reasons.

Figure 9:
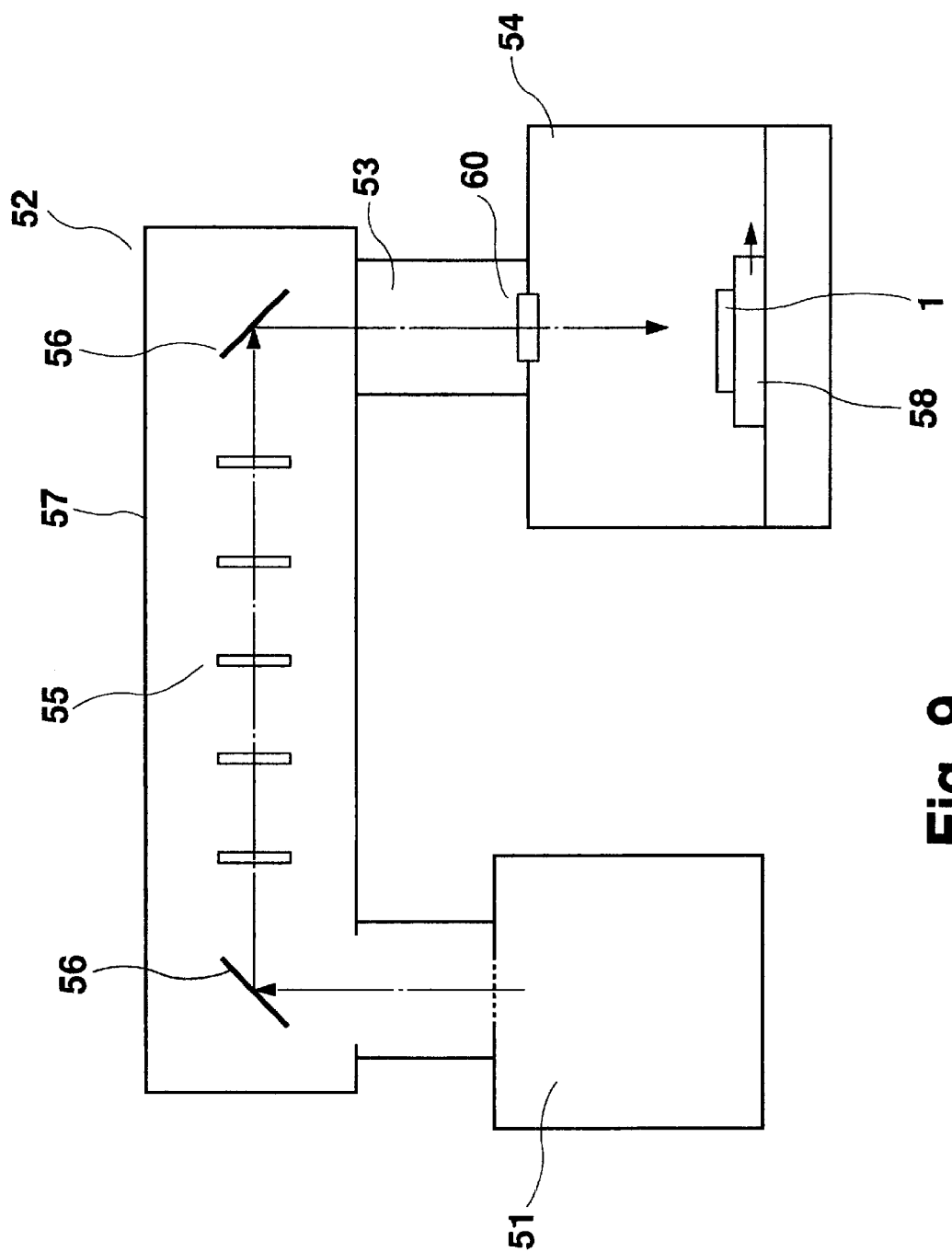
FIG. 9 is a view showing a structure of a laser beam irradiation apparatus to be used for the embodiment of the present invention.

FIG. 9 is a view showing a structure of a laser annealing apparatus for performing laser annealing. The reference numeral 51 denotes an oscillation source for generating a pulse laser beam, the reference numeral 52 denotes an optical system including a lens 55 and a mirror 56, the reference numeral 53 denotes a final irradiated portion, and the reference numeral 54 denotes a process chamber in which a stage 58 for supporting a processed substrate 1 is provided. A laser beam such as an excimer laser beam generated in the laser oscillation source 51 is sent to the optical system 52. In the optical system 52, a cylindrical lens, a condenser lens and the like are used for the lens 55, through which the laser beam is passed and is shaped to have a predetermined section. The laser beam is a square. Specifically, the laser beam has the shape of a line in which a length in a direction of a major axis is much greater than a length in a direction of a minor axis. The line beam is irradiated on the treated substrate 1 in the chamber 54 through a transparent window 60 provided in the chamber 54. The stage 58 on which the treated substrate 1 is mounted is movable on a plane in horizontal and vertical directions, and the line beam is relatively scanned over the treated substrate 1.

Figure 10:
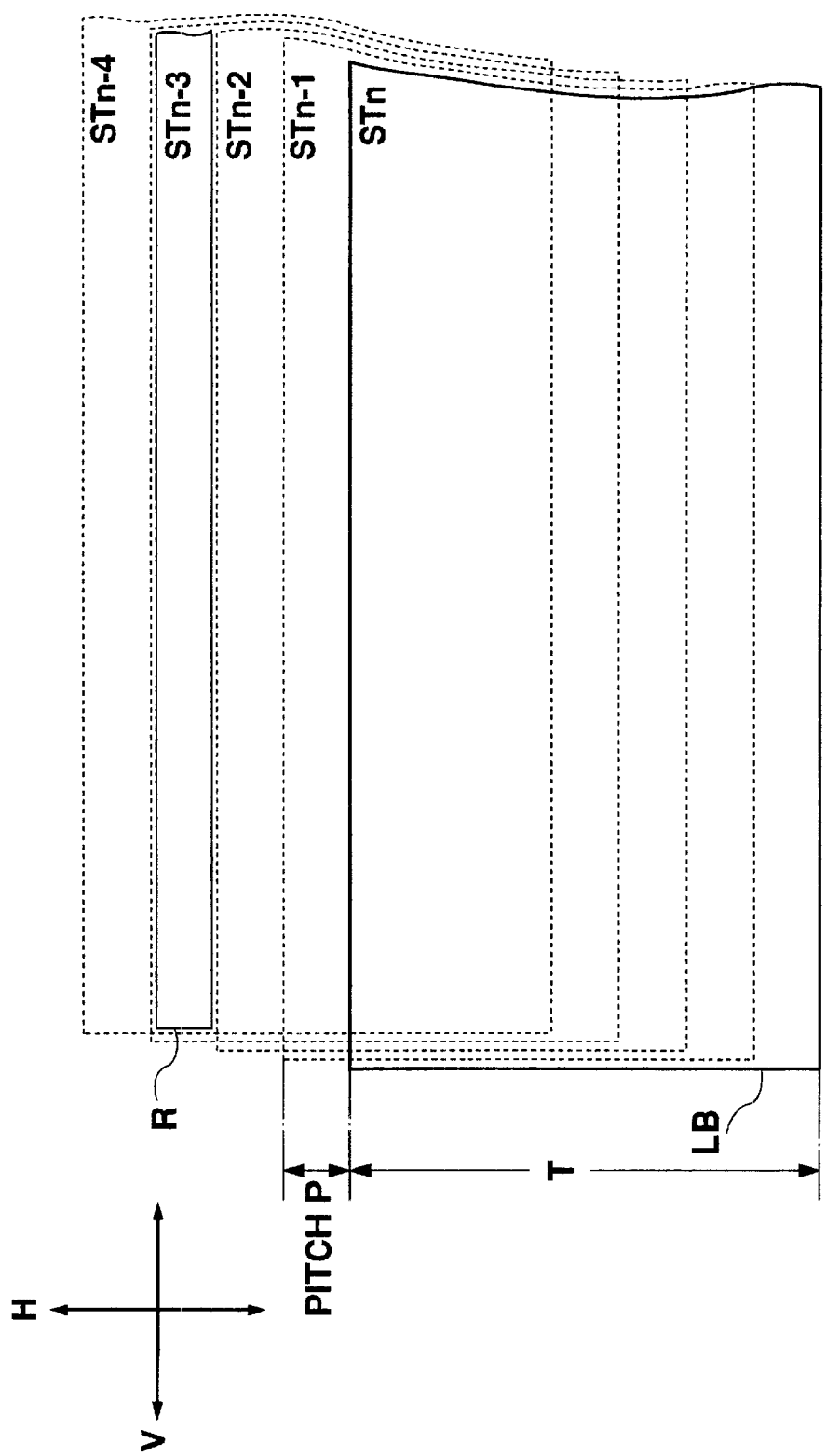
FIG. 10 is a view showing a state in which a line beam is scanned.

As shown in FIG. 10, each shot STn of the pulse laser beam is sequentially shifted in the direction of a minor axis, that is, the horizontal direction H, so that the line beam LB is scanned. A line width T and a line length of the line beam LB are set by the laser oscillation source 51 and the optical system 52 of the laser annealing device shown in FIG. 9. More specifically, an oscillation frequency of the laser oscillation source 51 is set to about 200 to 300 Hz, for example 290 Hz, in order to obtain stability between shots of the pulse laser beam, and the line width T of the line beam LB is set to 100 to 1000 μm, for example 600 μm, in order to obtain uniformity of energy density in a region where the line beam LB is irradiated. Furthermore, at the same time that a throughput is determined by a scanning speed, that is, a stage moving speed of the stage 58, an overlap amount, that is, a pitch P between the shots STn is determined. For example, P=30 μm is set to successively irradiate 20 shots on the same point of the semiconductor film.

An irradiation energy of the pulse laser beam varies in each shot. If the irradiation energy of a shot is outside a very small optimum range between Ed and Eu, defective crystallization is performed causing the shot to result in failure. In FIG. 10, for example, if a shot STn-3 results in failure, regions where succeeding shots STn-2, STn-1, . . . are overlapped are recrystallized so that the failure of the shot STn-3 is recovered. In a rearmost band-shaped region of the shot STn-3, defective crystallization is not recovered because the shot STn-3 is the final shot. Consequently, the rearmost band-shaped region of the shot STn-3 remains as a defective crystallization region R. More specifically, it is apparent that the defective crystallization region R has a slender shape extending perpendicularly to the scanning direction of the line beam LB, and has a line width T equal to a pitch P of the pulse laser beam.

$$W \cdot \sin \theta = P$$

Figure 11:
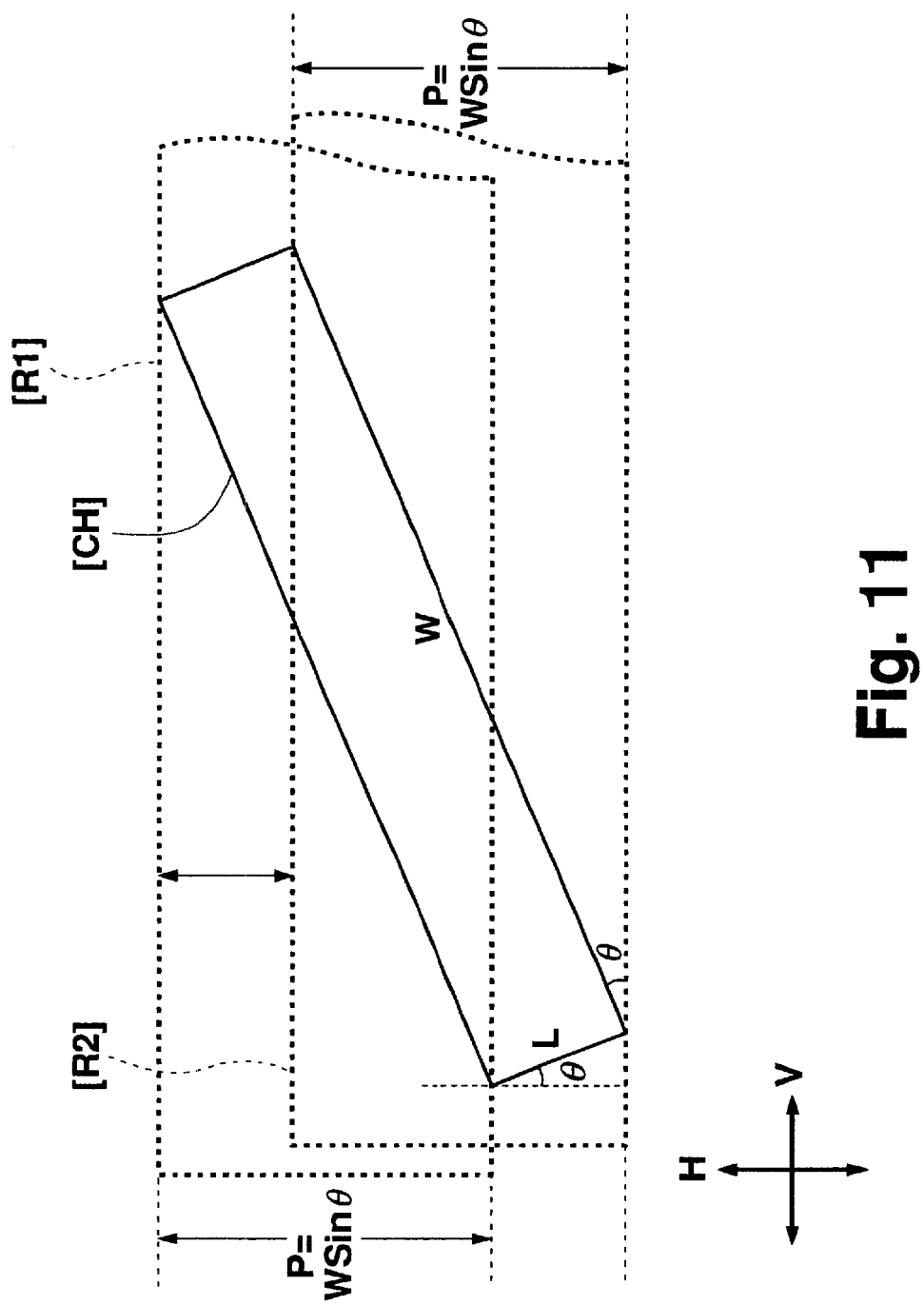
FIG. 11 is a view showing a positional relationship between a channel region and a defective crystallization region according to the embodiment of the present invention.

When a channel width W, the pulse pitch P and an angle θ have the above-mentioned relationship, a moving path MN in the channel region CH cannot avoid passing through the defective crystallization region R if the defective crystallization region R is positioned between R1 and R2 on the channel region CH as shown in FIG. 11. Consequently, the moving path (MN) is deteriorated over the whole channel width.

Accordingly, the relationship among the channel width W, the pulse pitch P and the angle θ is set to the following expression (1).

$$W \cdot \sin \theta > P \qquad (1)$$

Consequently, even if the defective crystallization region R is generated across the channel region CH, a probability that the moving path MN in the channel region CH might be blocked over the whole channel width by the defective crystallization region R is reduced and a part MG of the moving path is positioned on the outside of the defective crystallization region R in the channel region CH. Consequently, characteristics of the whole TFT can be prevented from being deteriorated so that excellent element characteristics can be obtained.

In the present embodiment, furthermore, the TFT is formed in such a manner that a direction of the channel width of the channel region CH is different from directions of sides of the line beam LB. Therefore, even if the defective crystallization region R is generated across the channel region CH, a part of the channel region CH is out of the defective crystallization region R so that a part MG of the moving path is kept in good condition. Thus, excellent element characteristics can be obtained.

A second embodiment of the present invention will be described below.

Figure 12:
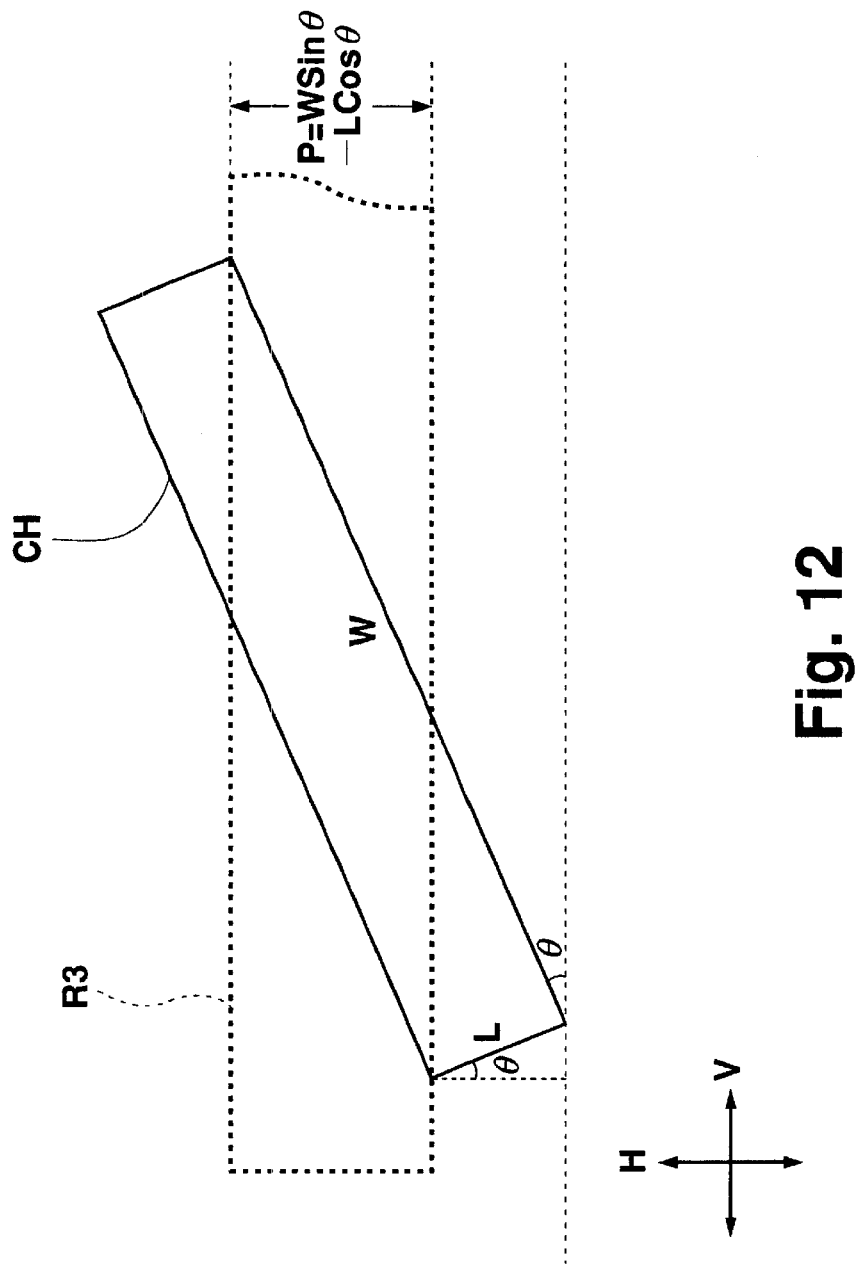
FIG. 12 is a view showing a positional relationship between a channel region and a defective crystallization region according to another embodiment of the present invention, which is different from FIG. 11.

As shown in FIG. 12, when a channel length L and a channel width W of a TFT, a pulse pitch P and an angle θ have a relationship represented by the following expression (2), a moving path MN in a channel region CH cannot avoid passing through a defective crystallization region R when the defective crystallization region R is positioned on R3 in FIG. 12. Accordingly, the moving path MN is deteriorated over the whole channel width W so that elements become defective.

$$W \cdot \sin \theta - L \cdot \cos \theta = P \qquad (2)$$

In the second embodiment of the present invention, accordingly, the relationship among the channel length L and the channel width W of the channel region CH, the pulse pitch P and the angle θ is set to the following expression (3).

$$W \cdot \sin \theta \cdot L \cdot \cos \theta > P \qquad (3)$$

Consequently, even if the defective crystallization region R is generated through the channel region CH, the moving path MN in the channel region CH is rarely blocked over the whole channel width by the defective crystallization region R and a part MG of the moving path always avoids passing through the defective crystallization region R in the channel region CH so that deterioration can be prevented. Therefore, more excellent element characteristics can be obtained.

A third embodiment of the present invention will be described below.

Figure 13:
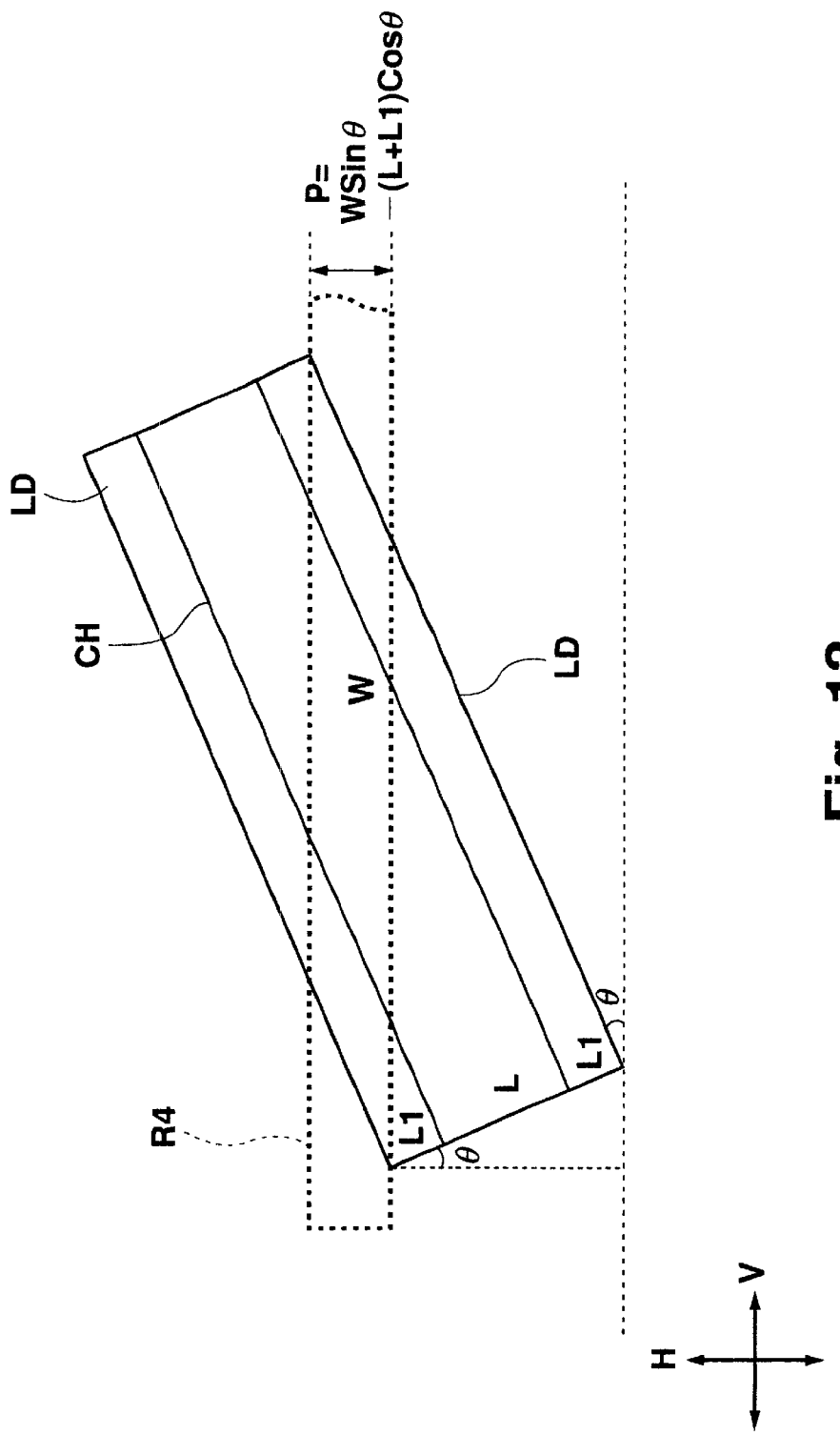
FIG. 13 is a view showing a positional relationship between a channel region and a defective crystallization region according to yet another embodiment of the present invention, which is different from FIGS. 11 and 12.

As shown in FIG. 13, if a channel length L of a channel region CH and a width L1 of an LD region LD, a channel width W, a pulse pitch P and an angle θ have a relationship represented by the following expression (4), a moving path MN in the LD region LD as well as the channel region CH cannot avoid passing through a defective crystallization region R when the defective crystallization region R is positioned on R4 in FIG. 13. Accordingly, the moving path MN is deteriorated over the whole channel width W so that elements become defective.

$$W \cdot \sin \theta - (L + L1) \cdot \cos \theta = P \qquad (4)$$

In the third embodiment of the present invention, accordingly, the relationship among the channel length L of the channel region CH and the width L1 of the LD region LD, the channel width W, the pulse pitch P and the angle θ is set to the following expression (5).

$$W \cdot \sin \theta - (L + L1) \cdot \cos \theta > P \qquad (5)$$

Consequently, even if the defective crystallization region R is generated through the channel region CH and the LD region LD, the moving path MN in the channel region CH and the LD region LD is rarely blocked over the whole channel width by the defective crystallization region R and a part MG of the moving path can always avoid passing through the defective crystallization region R in the LD region LD as well as the channel region CH so that deterioration can be prevented. Therefore, much more excellent element characteristics can be obtained.

While the directions H and V have been set to the horizontal scanning direction H and the vertical scanning direction V of a display in the above description, they may have a reverse relationship. In any case, it is important that the directions H and V should be perpendicular to each other. Furthermore, directions of major and minor axes of a line beam LB and those of sides of a mother substrate 1 and an active matrix substrate 2 are coincident with the horizontal scanning direction H or the vertical scanning direction v.

A laser annealing method according to a fourth embodiment of the present invention will be described below. In the first to third embodiments described above, the direction of the channel width of the channel region CH on the mother substrate 1 and the active matrix substrate 2 satisfies any of the expressions (1), (3) and (5) with respect to the directions of the sides of the substrates 1 and 2 on the condition that the directions of the sides of the substrates 1 and 2 should be coincident with the directions of the major and minor axes of the line beam LB. On the other hand, in the fourth embodiment, the line beam LB is irradiated in such a manner that the channel region of a TFT on the substrate and a defective crystallization region R satisfy any of the expressions (1), (3) and (5) by keeping the relationship in which the directions of the sides of the substrates 1 and 2 are coincident with the direction of the channel width and by setting an angle formed by the directions of the sides of the substrates 1 and 2, and the directions of the major and minor axes of the line beam LB, as shown in FIG. 14, to θ.

Figure 14:
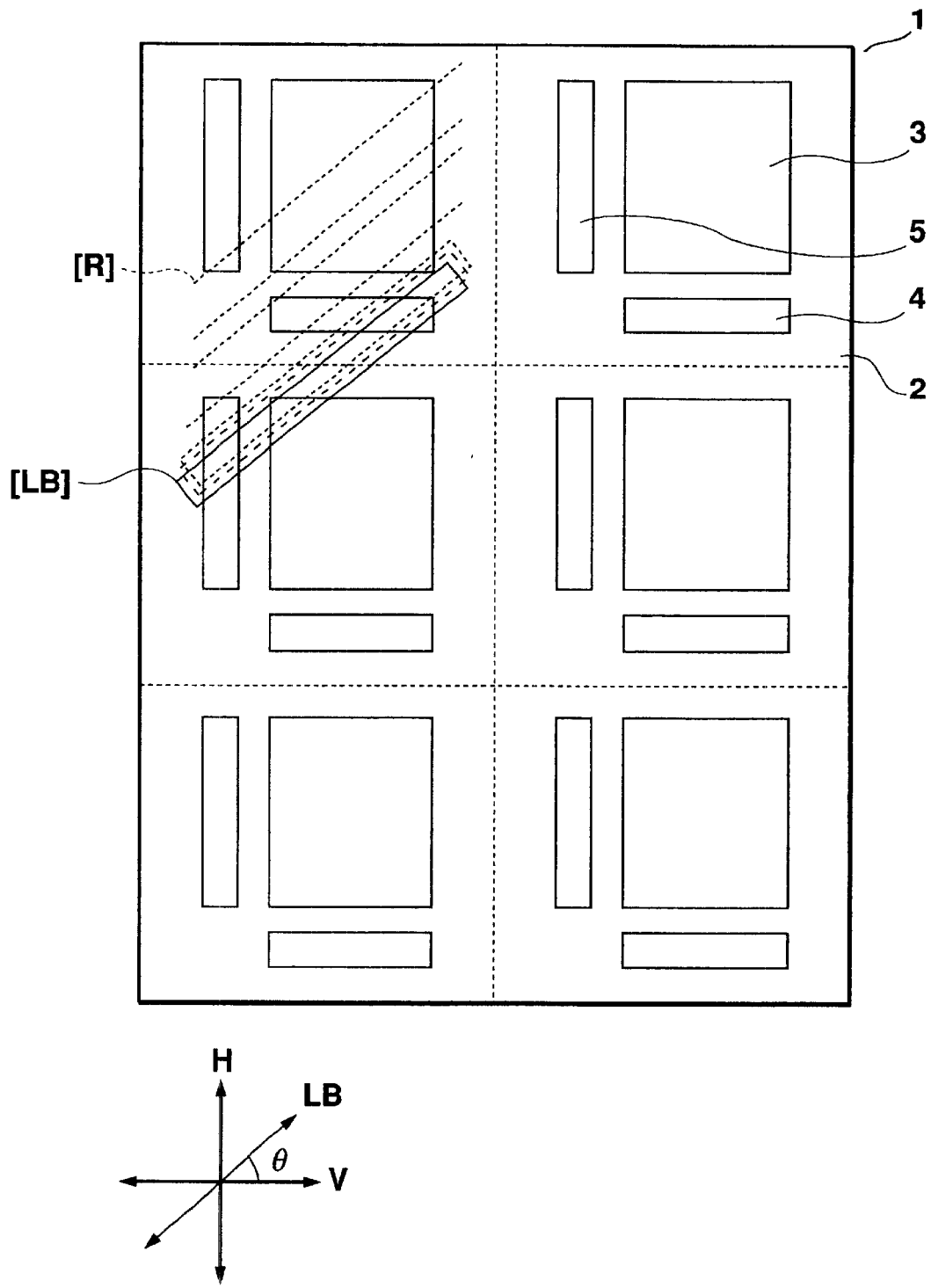
FIG. 14 is a view showing a layout of a treated substrate and each circuit element thereof and a general positional relationship between the treated substrate and a region where a line beam is irradiated according to a further embodiment of the present invention.

In order to position the line beam LB and the substrates 1 and 2 as shown in FIG. 14, any of directions of movement of the substrates 1 and 2 and the directions of the major and minor axes of the line beam LB emitted from the laser irradiation apparatus shown in FIG. 9 may be changed.

According to the first to fourth embodiments, in a semiconductor device having a plurality of semiconductor elements formed by a laser-annealed semiconductor film, a variation in an irradiation energy of a pulse laser beam can be prevented from affecting the characteristics of the semiconductor elements by adjusting the relationship among a size of the channel region, the pitch of the pulse laser beam, and the angle formed by the direction of the channel width of the channel region and the direction of the major axis of the region where the pulse laser beam is irradiated. Thus, a semiconductor device having excellent element characteristics can be manufactured.

A sixth embodiment of the present invention will be described below.

Figure 15:
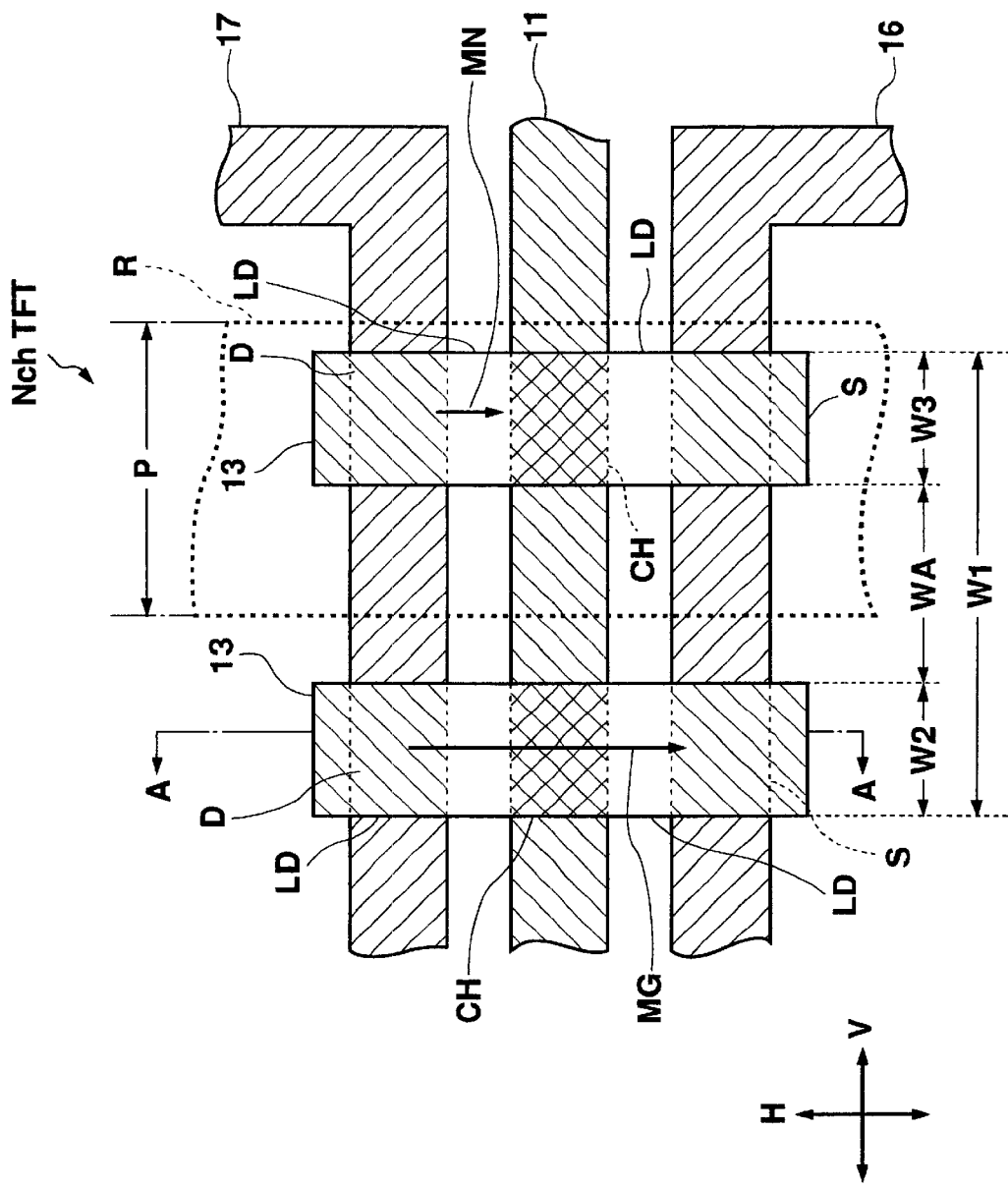
FIG. 15 is a view showing a planar structure of a TFT according to a further embodiment of the present invention.

FIG. 15 shows a planar structure of a TFT according to the sixth embodiment. For example, the TFT is provided in the driver sections 4 and 5 shown in FIG. 6, in particular, forms an inverter in drivers. A sectional structure taken along the line A—A in FIG. 15 is the same as in FIG. 8. The TFT according to the sixth embodiment has a channel region formed by a plurality of channel region parts which are separated from each other and are electrically connected in parallel. More specifically, separate island-shaped p-Si films 13 are formed to share a gate electrode 11, a source electrode 16 and a drain electrode 17 as shown in FIG. 15. In each p-Si film 13, a channel region part CH is formed in a portion overlapping the gate electrode 11, a lightly doped region LD which is lightly doped with an impurity is formed on both sides of each channel region part CH, and a source region S and a drain region D which are doped with an impurity having a high concentration are formed on the outside of the region LD. In this example and the above-mentioned examples, the TFT is an Nch TFT and has an LDD structure. In some cases, the TFT is a Pch TFT and has no LDD structure. In particular, the Pch TFT has no LDD structure, and the source region S and the drain region D which are doped with an impurity having a high concentration are formed on both sides of the channel region part CH.

In the sixth embodiment, a plurality of channel region parts of the TFT are formed separately in directions of channel widths. Furthermore, the TFT is formed such that a sum W1 of channel widths W2 and W3 of two channel region parts and a space WA between the two channel region parts is greater than a width of a defective crystallization region R (a pitch P of a pulse laser beam) generated during laser annealing in the same manner as in the first to fifth embodiments. In other words, if a channel width W of the TFT determined according to required TFT capabilities is constant in the sixth embodiment, the channel width W satisfies the following expression (6).

$$W=W2+W3 \tag{6}$$

The TFT is formed such that the sum W1 of the channel width W and the space WA satisfies a relationship with the pitch P of the pulse laser beam as represented by the following expression (7).

$$W1=W+WA>P \tag{7}$$

Figure 16:
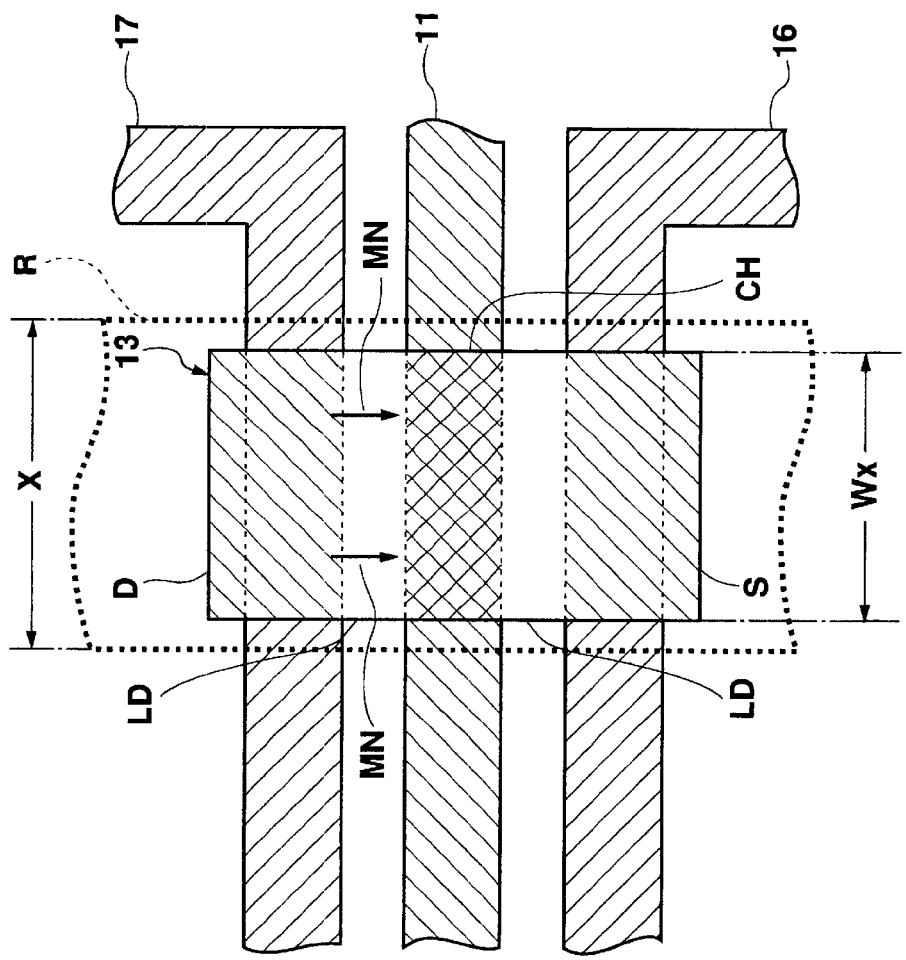
FIG. 16 is a view showing a planar structure of a TFT according to the related art.

FIG. 16 shows a planar structure of a TFT according to the related art corresponding to the TFT according to the sixth embodiment. In the TFT according to the related art, a channel region is integrally formed as shown in FIG. 16. In a case where the same performance characteristics are required, the channel width W of the TFT according to the sixth embodiment is made almost equal to a channel width Wx of the TFT shown in FIG. 16. If a defective crystallization region R is generated in such a state, the channel region is formed in the defective crystallization region R of the TFT shown in FIG. 16. However, if the channel regions are separately formed to satisfy the expressions. (6) and (7) as in the sixth embodiment, all the channel region parts can be prevented from being formed in the defective crystallization region R. As shown in FIG. 15, for example, while a right channel region part CH is occupied with the defective crystallization region R, a left channel region part CH is kept off the defective crystallization region R. Accordingly, a moving path MG having a width W2 is kept in a substantially good condition in the TFT shown in FIG. 15.

Consequently, even if the defective crystallization region R having a width P is generated through a region where the TFT is formed, the whole channel width W of the channel region CH is not occupied by the defective crystallization region R. The moving path MG formed in the channel region part CH on the outside of the defective crystallization region R can produce excellent element characteristics.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method of manufacturing a semiconductor device having a plurality of semiconductor elements on a substrate, comprising polycrystallizing a channel region of at least one of the semiconductor elements by irradiation of a pulse laser beam, wherein a channel width W of the channel region is greater than a mutual pitch P of the pulse laser beam irradiated by shifting a position, a direction of the channel width W of the channel region being not coincident with directions of major and minor axes of a region where the pulse laser beam is irradiated.

2. The semiconductor device method according to claim 1, wherein directions of sides of the substrate are approximately parallel to the respective directions of the major and minor axes of the region where the pulse laser beam is irradiated, and the direction of the channel width W of the channel region is different from the directions of the sides of the substrate.

3. The method according to claim 1, wherein one of the directions of sides of the substrate is approximately parallel to the direction of the channel width W of the channel region, and the directions of the major and minor axes of the region where the pulse laser beam is irradiated are different from the directions of the sides of the substrate.

4. The method according to claim 1, wherein the channel width W of the channel region, the pitch P of the pulse laser beam, and an angle θ formed by the direction of the channel width W of the channel region and the direction of the major axis of the region where the pulse laser beam is irradiated have a relationship satisfying:

$$W \cdot \sin \theta > P.$$

5. The method according to claim 1, wherein the channel width W of the channel region, a channel length L of the channel region, the pitch P of the pulse laser beam, and an angle θ formed by the direction of the channel width W of the channel region and the direction of the major axis of the region where the pulse laser beam is irradiated have a relationship satisfying:

$$W \cdot \sin \theta - L \cdot \cos \theta > P.$$

6. A method of manufacturing a semiconductor device, comprising:

forming an amorphous semiconductor film on a substrate;

polycrystallizing the amorphous semiconductor film by irradiating a laser pulse beam on the amorphous semiconductor film;

forming a channel region in an island region of the polycrystallized semiconductor film;

forming a gate electrode to overlap the channel region; and forming an insulation film sandwiched between the gate electrode and the polycrystallized semiconductor film, wherein the channel region has a channel width W greater than a mutual pitch P of the pulse laser beam irradiated by shifting a position, a direction of the channel width W being not coincident with directions of major and minor axes of a region where the pulse laser beam is irradiated.

7. The method according to claim 6, wherein directions of sides of the substrate are approximately parallel to the respective directions of the major and minor axes of the region where the pulse laser beam is irradiated, and the direction of the channel width W of the channel region is different from the directions of the sides of the substrate.

8. The method according to claim 6, wherein one of the directions of sides of the substrate is approximately parallel to the direction of the channel width W of the channel region, and the directions of the major and minor axes of the region where the pulse laser beam is irradiated are different from the directions of the sides of the substrate.

9. The method according to claim 6, wherein the channel width W of the channel region, the pitch P of the pulse laser beam, and an angle θ formed by the direction of the channel width W of the channel region and the direction of the major axis of the region where the pulse laser beam is irradiated have a relationship satisfying:

$$W \cdot \sin\theta > P.$$

10. The method according to claim 6, wherein the channel width W of the channel region, a channel length L of the channel region, the pitch P of the pulse laser beam, and an angle θ formed by the direction of the channel width W of the channel region and the direction of the major axis of the region where the pulse laser beam is irradiated have a relationship satisfying:

$$W \cdot \sin\theta - L \cdot \cos\theta > P.$$

11. The method according to claim 10, wherein directions of sides of the substrate are approximately parallel to the respective directions of the major and minor axes of the region where the pulse laser beam is irradiated, and an angle formed by the direction of the channel width W of the channel region and any one of the directions of the sides of the substrate is almost equal to the angle θ formed by the direction of the channel width W of the channel region and the direction of the major axis of the region where the pulse laser beam is irradiated.

12. The method according to claim 10, wherein one of the directions of sides of the substrate is approximately parallel to the direction of the channel width W of the channel region, and an angle formed by any one of the directions of the sides of the substrate and the directions of the major and minor axes of the region where the pulse laser beam is irradiated is almost equal to the angle 0 formed by the direction of the channel width of the channel region and the direction of the major axis of the region where the pulse laser beam is irradiated.

13. A method of manufacturing a semiconductor device, comprising:

forming an amorphous semiconductor film on a substrate;

polycrystallizing the amorphous semiconductor film by irradiating a laser pulse beam on the amorphous semiconductor film;

forming a channel region in an island region of the polycrystallized semiconductor film;

forming a gate electrode to overlap the channel region;

forming an insulation film sandwiched between the gate electrode and the polycrystallized semiconductor film, wherein the channel region has a channel width W greater than a mutual pitch P of the pulse laser beam irradiated by shifting a position, a direction of the channel width W being not coincident with directions of major and minor axes of a region where the pulse laser beam is irradiated;

forming a lightly doped region on the polycrystallized silicon film and respectively on opposite sides of the channel region by doping impurities having a low concentration; and forming a source region and a drain region on the polycrystallized silicon film and respectively on opposite sides of the channel region by doping impurities having a high concentration.

14. The method according to claim 13, wherein directions of sides of the substrate are approximately parallel to the respective directions of the major and minor axes of the region where the pulse laser beam is irradiated, and the direction of the channel width W of the channel region is different from the directions of the sides of the substrate.

15. The method according to claim 13, wherein one of the directions of sides of the substrate is approximately parallel to the direction of the channel width W of the channel region, and the directions of the major and minor axes of the region where the pulse laser beam is irradiated are different from the directions of the sides of the substrate.

16. The method according to claim 13, wherein the channel width W of the channel region, a channel length L of the channel region, a length L1 of the lightly doped region, the pitch P of the pulse laser beam, and an angle θ formed by the direction of the channel width W of the channel region and the direction of the major axis of the region where the pulse laser beam is irradiated have a relationship satisfying:

$$W \cdot \sin\theta - (L+L1) \cdot \cos\theta > P.$$

17. The method according to claim 16, wherein directions of sides of the substrate are approximately parallel to the respective directions of the major and minor axes of the region where the pulse laser beam is irradiated, and an angle formed by the direction of the channel width W of the channel region and any one of the directions of the sides of the substrate is almost equal to the angle θ formed by the direction of the channel width W of the channel region and the direction of the major axis of the region where the pulse laser beam is irradiated.

18. The method according to claim 16, wherein one of the directions of sides of the substrate is approximately parallel to the direction of the channel width W of the channel region, and an angle formed by anyone of the directions of the sides of the substrate and the directions of the major and minor axes of the region where the pulse laser beam is irradiated is almost equal to the angle θ formed by the direction of the channel width W of the channel region and the direction of the major axis of the region where the pulse laser beam is irradiated.

19. A method of manufacturing a display device having a plurality of first thin film transistors on a substrate for respectively supplying display signals and a plurality of second thin film transistors on the substrate for driving the plurality of first thin film transistors, comprising:

forming a first amorphous thin film of the plurality of first thin film transistors;

forming a second amorphous thin film of the plurality of second thin film transistors; and polycrystallizing the first and/or second amorphous thin films by irradiating a pulse laser beam on the first and/or second amorphous thin films, wherein at least one of the plurality of second thin film transistors has a channel region with a channel width W greater than a mutual pitch P of the pulse laser beam irradiated by shifting a position, a direction of the channel width W being not coincident with directions of major and minor axes of a region where the pulse laser beam is irradiated.

20. The method according to claim 19, wherein directions of sides of the substrate are approximately parallel to the respective directions of the major and minor axes of the region where the pulse laser beam is irradiated, and the direction of the channel width W of the channel region is different from the directions of the sides of the substrate.

21. The method according to claim 19, wherein one of the directions of sides of the substrate is approximately parallel to the direction of the channel width W of the channel region, and the directions of the major and minor axes of the region where the pulse laser beam is irradiated are different from the directions of the sides of the substrate.

22. The method according to claim 19, wherein the channel width W of the channel region, the pitch P of the pulse laser beam, and an angle θ formed by the direction of the channel width W of the channel region and the direction of the major axis of the region where the pulse laser beam is irradiated have a relationship satisfying:

$$W \cdot \sin\theta > P.$$

23. A method of manufacturing a semiconductor device having a plurality of semiconductor elements on a substrate, at least one of the plurality of semiconductor elements having a channel region containing a plurality of channel region parts electrically connected in parallel, comprising:

forming an amorphous semiconductor film on the substrate, the channel region being defined in the amorphous semiconductor film; and polycrystallizing the amorphous semiconductor film by irradiating a pulse laser beam on the amorphous semiconductor film, wherein a sum of each of channel widths of the channel region parts and spaces between the channel region parts is greater than a mutual pitch of the pulse laser beam irradiated by shifting a position.

24. The method according to claim 23, wherein the channel region parts are separated respectively in directions of the channel widths.

25. A method of manufacturing a semiconductor display device having a plurality of first thin film transistors on a substrate for respectively supplying display signals and a plurality of second thin film transistors on the substrate for driving the plurality of first thin film transistors, comprising:

forming a first amorphous thin film of the plurality of first thin film transistors;

forming a second amorphous thin film of the plurality of second thin film transistors, wherein at least one of the plurality of second thin film transistors has a channel region formed in the second amorphous thin film by a plurality of channel region parts electrically connected in parallel; and polycrystallizing the first and/or second amorphous thin films by irradiating a pulse laser beam on the first and/or second amorphous thin films, wherein a sum of each of channel widths of the channel region parts and spaces between the channel region parts is greater than a mutual pitch of the pulse laser beam irradiated by shifting a position.

26. The method according to claim 25, wherein the channel region parts are separated respectively in directions of the channel widths.

27. A method of manufacturing a semiconductor device having a plurality of semiconductor elements on a substrate, comprising polycrystallizing a channel region of at least one of the semiconductor elements by irradiation of a pulse laser beam, wherein a channel width W of the channel region is greater than a mutual pitch P of the pulse laser beam irradiated by shifting a position, a direction of the channel width W of the channel region is not coincident with directions of major and minor axes of a region where the pulse laser beam is irradiated, the pulse laser beam has a line shape, and the irradiation is performed using the pulse laser beam in a manner that the longer side of the irradiation region advances by the predetermined pitch P along a laser beam scanning direction.

28. A method of manufacturing a semiconductor device having a plurality of semiconductor elements on a substrate, comprising polycrystallizing a channel region of at least one of the semiconductor elements by irradiation of a pulse laser beam, wherein a channel width W of the channel region is greater than a mutual pitch P of the pulse laser beam irradiated by shifting a position, a direction of the channel width W of the channel region is not coincident with directions of major and minor axes of a region where the pulse laser beam is irradiated, and the irradiation is performed by irradiating the pulse laser beam formed to have a line shape in a scanning direction parallel with or vertical to the channel width direction of the semiconductor device.

* * * * *